(12) United States Patent
Kinoshita et al.

(10) Patent No.: US 8,009,835 B2
(45) Date of Patent: Aug. 30, 2011

(54) FREQUENCY MODULATION-TYPE TRANSMITTING APPARATUS

(75) Inventors: Masaki Kinoshita, Gunma-Ken (JP);
Nobuo Takahashi, Gunma-Ken (JP);
Satoshi Terada, Gunma-Ken (JP)

(73) Assignee: Sanyo Electric Co., Ltd., Osaka (JP)

( * ) Notice: Subject to any disclaimer, the term of this patent is extended or adjusted under 35 U.S.C. 154(b) by 1371 days.

(21) Appl. No.: 11/528,874

(22) Filed: Sep. 28, 2006

(65) Prior Publication Data

US 2007/0076815 A1    Apr. 5, 2007

(30) Foreign Application Priority Data

Oct. 5, 2005 (JP) ................................. 2005-291933

(51) Int. Cl.
*H04H 20/47* (2008.01)
*H04H 20/88* (2008.01)
*H04H 40/36* (2008.01)
*H04H 20/48* (2008.01)
*H04H 40/45* (2008.01)
*H03G 3/00* (2006.01)

(52) U.S. Cl. ................ 381/2; 381/3; 381/107; 381/108

(58) Field of Classification Search .................. 381/107, 381/2, 3, 108, 77, 79; 455/108, 113, 115.3, 455/118, 127

See application file for complete search history.

(56) References Cited

U.S. PATENT DOCUMENTS 5,001,757 A * 3/1991 Field et al. ...................... 381/13
5,483,600 A * 1/1996 Werrbach ...................... 381/106
5,907,261 A    5/1999 Jones
2004/0185807 A1 * 9/2004 Ramachandran ........... 455/127.1

FOREIGN PATENT DOCUMENTS

| CN | 1243615 A | 2/2000 |
| JP | 54059004 A | 5/1979 |
| JP | 6338810 A | 12/1994 |
| JP | 2000201027 A | 7/2000 |
| WO | 99/13570 A1 | 3/1999 |

OTHER PUBLICATIONS

Japanese Office Action for Application No. 2005-291933 mailed on Nov. 2, 2010 (5 pages).
esp@cenet Patent Abstract for Japanese Publication No. 6338810, publication date Dec. 6, 1994. (1 page).
esp@cenet Patent Abstract for Japanese Publication No. 2000201027, publication date Jul. 18, 2000 (1 page).

(Continued)

*Primary Examiner* — Vivian Chin
*Assistant Examiner* — Douglas Suthers
(74) *Attorney, Agent, or Firm* — Osha • Liang LLP

(57) ABSTRACT

A front-end processing circuit applies predetermined processing to an input signal and outputs a processed signal. A frequency modulation circuit applies frequency modulation to the output signal of the front-end processing circuit and outputs a processed signal. The front-end processing circuit includes a variable amplifier and a level detector. The variable amplifier receives a feedback signal and amplifies a signal by an amplification factor corresponding to the feedback signal. The level detector outputs the feedback signal to the variable amplifier in accordance with a level of a signal obtainable in a circuit succeeding the variable amplifier. The front-end processing circuit maintains the signal supplied to the frequency modulation circuit at a constant level.

2 Claims, 12 Drawing Sheets

OTHER PUBLICATIONS esp@cenet Patent Abstract for Japanese Publication No. 54059004, publication date May 12, 1979. (1 page).
English abstract for Chinese Publication No. 1243615, publication date Feb. 2, 2000, esp@cenet database, (1 page).
"Principal and Application of FM Stereo Transmitting Chip BA1404", Zhu, Yonghui, International Electronic Elements, vol. 8, pp. 10-11, 4th term of 2000).
Chinese Office Action for Application No. 2006101543212, mailed on Mar. 13, 2009 (9 pages).

* cited by examiner

FREQUENCY MODULATION-TYPE TRANSMITTING APPARATUS

CROSS-REFERENCE TO RELATED APPLICATIONS

The entire disclosure of Japanese Patent Application No. 2005-291933 including specifications, claims, drawings, and abstracts is incorporated herein by references.

BACKGROUND OF THE INVENTION

1. Field of the Invention

The present invention relates to a frequency modulation-type transmitting apparatus that can automatically adjust a frequency modulation factor.

2. Description of the Related Art

Frequency modulation (FM) can be applied to stereo audio signals. A transmitting apparatus is generally configured to output electromagnetic waves carrying a modulated signal via an antenna.

FIG. 11 is a block diagram showing a fundamental arrangement of a conventional frequency modulation type transmitting apparatus 100 applicable to stereo audio signals. The transmitting apparatus 100 includes a front-end processing circuit 10, a frequency modulation circuit 12, an amplifying circuit 14, and an antenna 16.

The front-end processing circuit 10 includes two preamps 10a, two limiters 10b, two low-pass filters 10c, and a single mixer 10d. The front-end processing circuit 10 receives right and left audio signals from an external player or an audio LSI. The right audio signal is processed by one set of the preamp 10a, the limiter 10b, and the low-pass filter 10c dedicated for the right audio signal. The left audio signal is processed by the other set of the preamp 10a, the limiter 10b, and the low-pass filter 10c dedicated for the left audio signal. The mixer 10d mixes the processed right and left audio signals and outputs a composite signal Sc.

The frequency modulation circuit 12 includes an oscillation circuit 12a. The oscillation circuit 12a shown in FIG. 11 is a clapp oscillator including a varactor diode D whose capacitance is varied in accordance with the composite signal Sc supplied from the front-end processing circuit 10. The frequency modulation circuit 12 outputs a frequency modulated signal $S_{FM}$ having a frequency corresponding to the amplitude (voltage value) of the composite signal Sc. More specifically, the frequency modulation circuit 12 operates as a voltage controlled oscillator (VCO) that modulates a change occurring in the amplitude (voltage value) of the composite signal Sc into a change in the frequency of the frequency modulated signal $S_{FM}$.

The amplifying circuit 14 amplifies the frequency modulated signal $S_{FM}$ produced from the frequency modulation circuit 12 and transmits the amplified signal via the antenna 16.

When the frequency modulated signal $S_{FM}$ is demodulated, a receiving circuit including a frequency modulation detector can be used. The frequency modulation detector receives the frequency modulated signal $S_{FM}$ and demodulates the change occurring in the frequency of the frequency modulated signal $S_{FM}$ into a change in the voltage of an output signal, and outputs a demodulated signal.

When the frequency modulation detector inputs a carrier, i.e., a signal being not yet frequency modulated, the non-modulated noise depending on a modulation factor B is produced from the frequency modulation detector. The non-modulated noise does not depend on a frequency modulation factor A of the transmitting apparatus 100. More specifically, the receiving apparatus produces an output signal having an S/N ratio equal to a ratio of the modulation factor B to the modulation factor A.

Accordingly, to realize an excellent S/N ratio, it is desirable to increase the frequency modulation factor A of the transmitting apparatus 100. On the other hand, the modulation factor B allowable by the frequency modulation detector in the receiving apparatus is limited.

In view of the foregoing, it is desirable to set an appropriate value for the frequency modulation factor A of the transmitting apparatus 100 with reference to the modulation factor B allowable in the frequency modulation detector. In general, the modulation factor can be expressed as a ratio of the carrier to the signal.

The transmitting apparatus 100 shown in FIG. 11 does not include any arrangement capable of controlling the frequency modulation factor A. It is therefore necessary to control the amplitude of a signal applied to the varactor diode involved in the frequency modulation circuit 12. The following are practical methods presently available for controlling the amplitude of a signal applied to the varactor diode.

(1) A user can manually adjust the level of a signal input to the transmitting apparatus 100. For example, a user can manually adjust the volume of an external player or an audio LSI. Adjusting the level of the signal input to the transmitting apparatus 100 can appropriately control the frequency modulation factor of the transmitting apparatus 100. It is also possible to store, in a register, the signal level when the user manually adjusted the external player or the audio LSI, and provide a circuit capable of automatically equalizing the signal level to a registered value.

(2) As shown in FIG. 12, the front-end processing circuit 10 can include two electronic voltage controllers 10e each intervening between the preamp 10a and the limiter 10b. The electronic voltage controller 10e can adjust its output depending on a setting value of a register 10f. A user can manually change the setting value of the register 10f to adjust the level of a signal input to the frequency modulation circuit 12, so that the frequency modulation factor A of the transmitting apparatus 100 can be appropriately controlled.

However, the above-described methods (1) and (2) require a user's manual operation (volume control) to adjust the signal level or a control circuit equipped with a memory (e.g., a register) capable of storing the signal level being manually set as an appropriate value.

It is generally difficult and impractical to rely on a user's manual adjustment to constantly maintain the signal level to an appropriate value. Furthermore, when the control circuit including a memory capable of storing a predetermined signal level is provided, the circuit scale of the transmitting apparatus 100 becomes larger and the manufacturing cost will increase.

SUMMARY OF THE INVENTION

The present invention provides a transmitting apparatus including: a front-end processing circuit applying predetermined processing to an input signal and outputting a processed signal; and a frequency modulation circuit applying frequency modulation to the output signal of the front-end processing circuit and outputting a processed signal. The front-end processing circuit includes a variable amplifier receiving a feedback signal and amplifying a signal by an amplification factor corresponding to the feedback signal, and a level detector outputting the feedback signal to the variable amplifier in accordance with a level of a signal obtainable in a circuit succeeding the variable amplifier. The front-end processing circuit maintains the signal supplied to the frequency modulation circuit at a constant level.

BRIEF DESCRIPTION OF THE DRAWINGS

Preferred embodiments of the present invention will be described in detail based on the following drawings, wherein.

DESCRIPTION OF PREFERRED EMBODIMENTS

Figure 1:
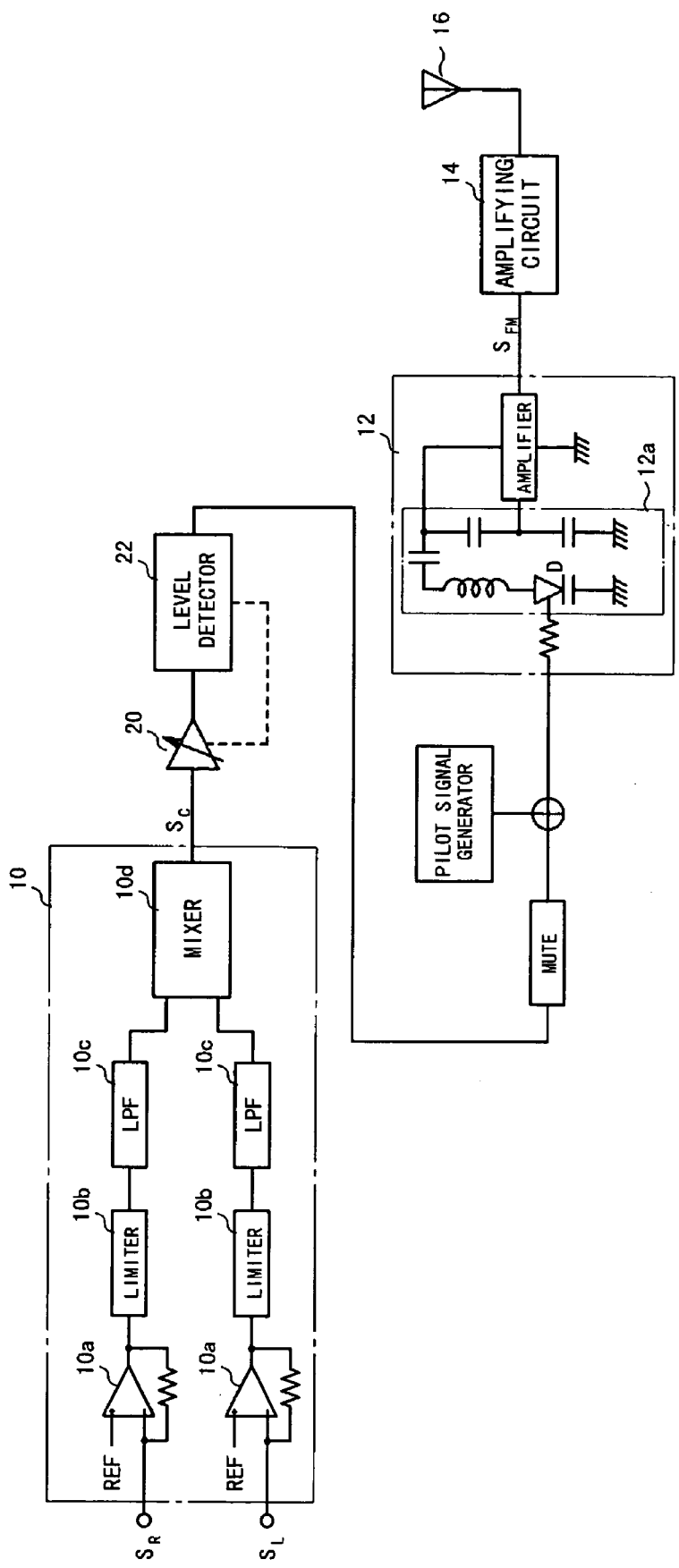
FIG. 1 is a block diagram showing a transmission circuit in accordance with a preferred embodiment of the present invention.
Figure 11:
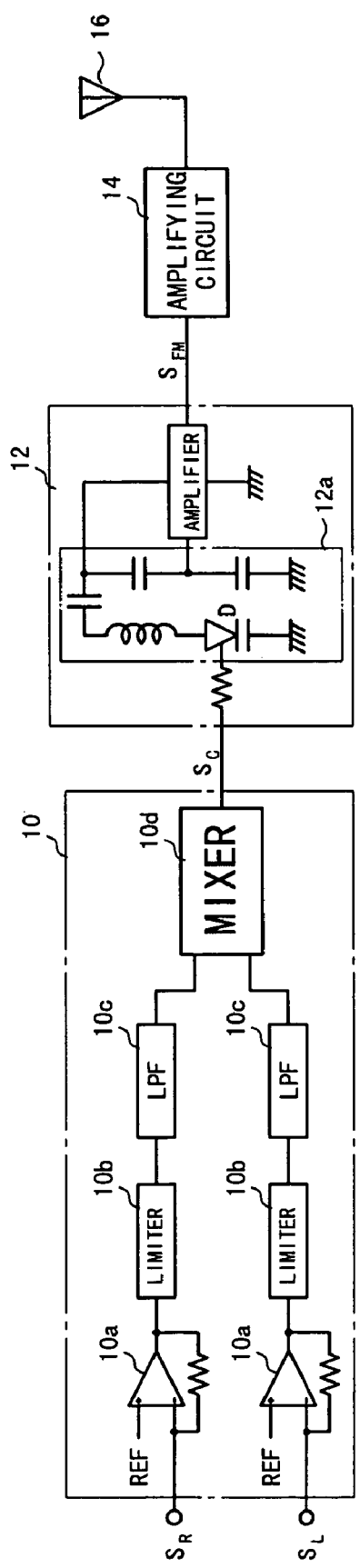
FIG. 11 is a block diagram showing a conventional transmission circuit.
Figure 12:
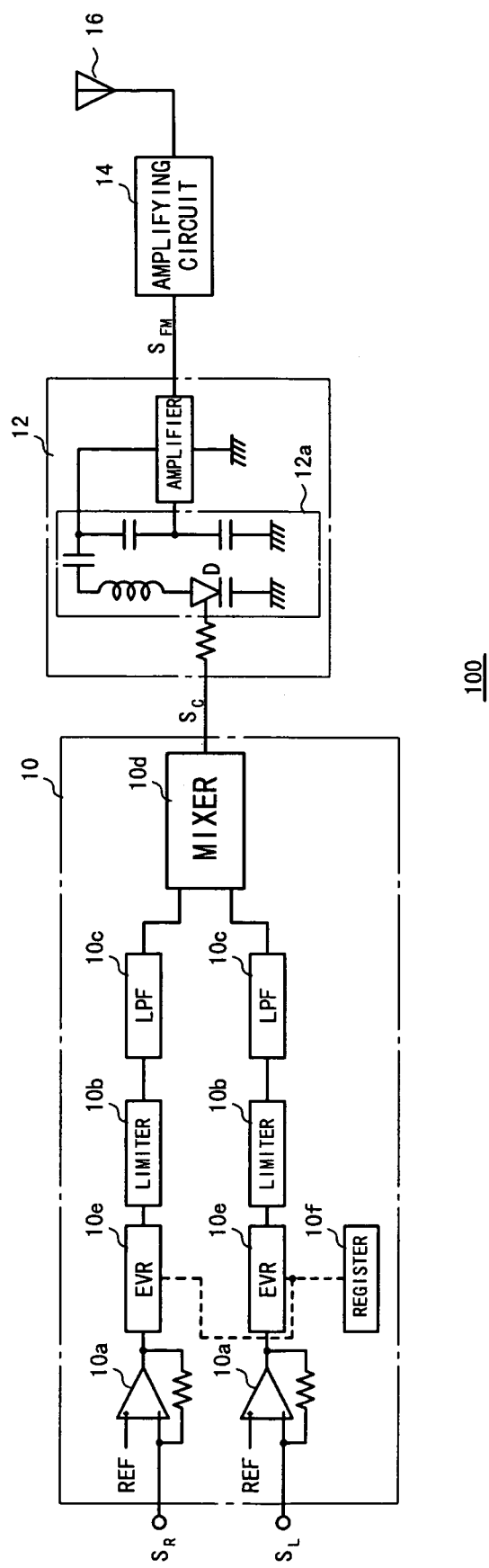
FIG. 12 is a block diagram showing another conventional transmission circuit.

FIG. 1 shows a transmitting apparatus 200 in accordance with a preferred embodiment of the present invention. The transmitting apparatus 200, as shown in FIG. 1, includes a front-end processing circuit 10, a frequency modulation circuit 12, an amplifying circuit 14, an antenna 16, a variable amplifier 20 and a level detector 22. The front-end processing circuit 10, the frequency modulation circuit 12, the amplifying circuit 14 and the antenna 16 constituting the transmitting apparatus 200 are functionally similar to the corresponding components of the conventional transmitting apparatus 100 shown in FIG. 11.

The variable amplifier 20 and the level detector 22 are located between the front-end processing circuit 10 and the frequency modulation circuit 12. The variable amplifier 20 receives the composite signal Sc produced from the front-end processing circuit 10, and amplifies the composite signal Sc by an amplification factor (gain) corresponding to a feedback signal produced from the level detector 22. The variable amplifier 20 outputs the amplified signal to the frequency modulation circuit 12 and to the level detector 22.

The level detector 22 receives the output signal of the variable amplifier 20 and returns a feedback signal to the variable amplifier 20 to control the amplification factor (gain) of the variable amplifier 20 so that the output signal is maintained at a constant level (amplitude).

In this manner, the variable amplifier 20 and the level detector 22 cooperatively constitute an automatic gain controller (AGC) that automatically adjusts the level of a signal input to the frequency modulation circuit 12 to a constant value. In other words, providing the variable amplifier 20 and the level detector 22 can maintain the level of a signal applied to the varactor diode of the frequency modulation circuit 12 and can also maintain the frequency modulation factor of the transmitting apparatus 100 at an appropriate value.

According to the transmitting apparatus 200 shown in FIG. 1, the level detector 22 detects the level of an output signal of the front-end processing circuit 10 which mixes the right and left audio signals, so as to constitute a loop circuit of the automatic gain controller before a pilot signal having a frequency equal to 19 kHz is added.

Figure 2:
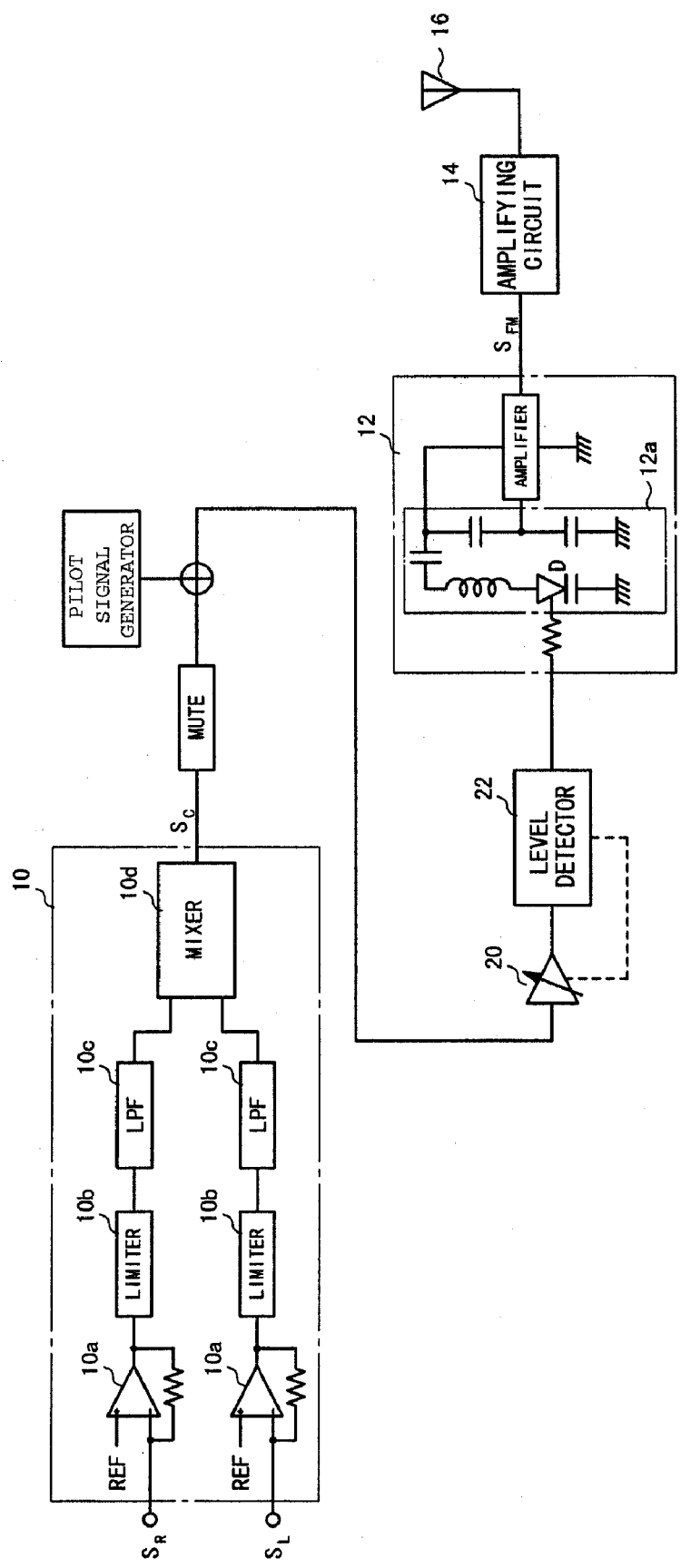
FIG. 2 is a block diagram showing another transmission circuit in accordance with a preferred embodiment of the present invention.

FIG. 2 shows another transmitting apparatus 202 according to a preferred embodiment of the present invention, characterized in that the level detector 22 is located at a rear stage to input a signal containing a pilot signal added beforehand, so as to constitute a loop circuit of the automatic gain controller that applies the level detection to the signal containing the added pilot signal.

Figure 3:
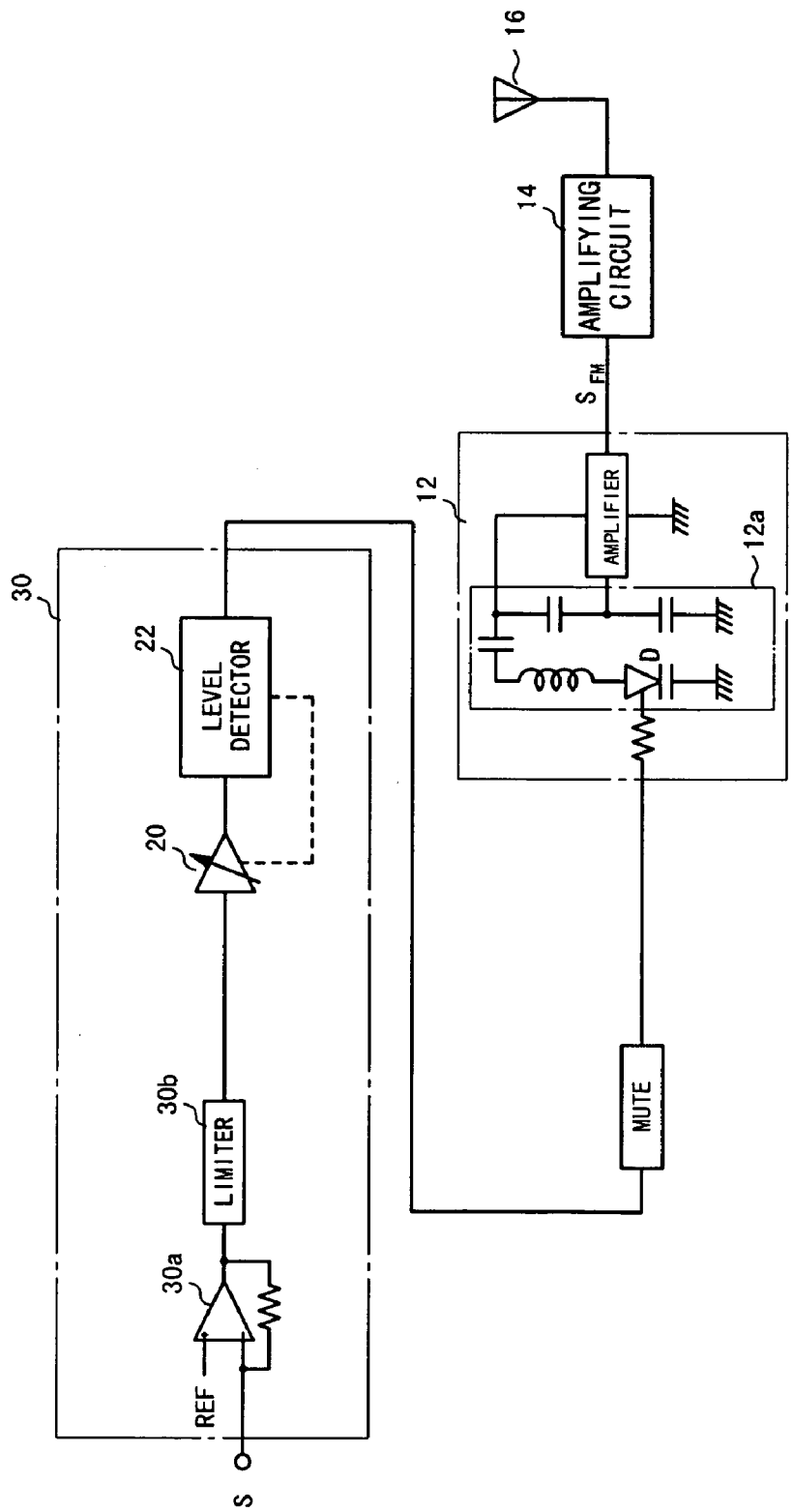
FIG. 3 is a block diagram showing yet another transmission circuit in accordance with a preferred embodiment of the present invention.

FIG. 3 shows yet another transmitting apparatus 204 according to a preferred embodiment of the present invention, preferably employable when a frequency-modulated monaural audio signal is transmitted, according to which the front-end processing circuit 10 is replaced with a front-end processing circuit 30. The front-end processing circuit 30 includes a preamp 30a, a limiter 30b, a variable amplifier 20 and a level detector 22. The front-end processing circuit 30 receives a monaural audio signal from an external player or an audio LSI. The preamp 30a and the limiter 30b process the received audio signal.

The variable amplifier 20 and the level detector 22 cooperatively constitute an automatic gain controller that can maintain the level of a signal supplied to the frequency modulation circuit 12 at a constant value.

Figure 4:
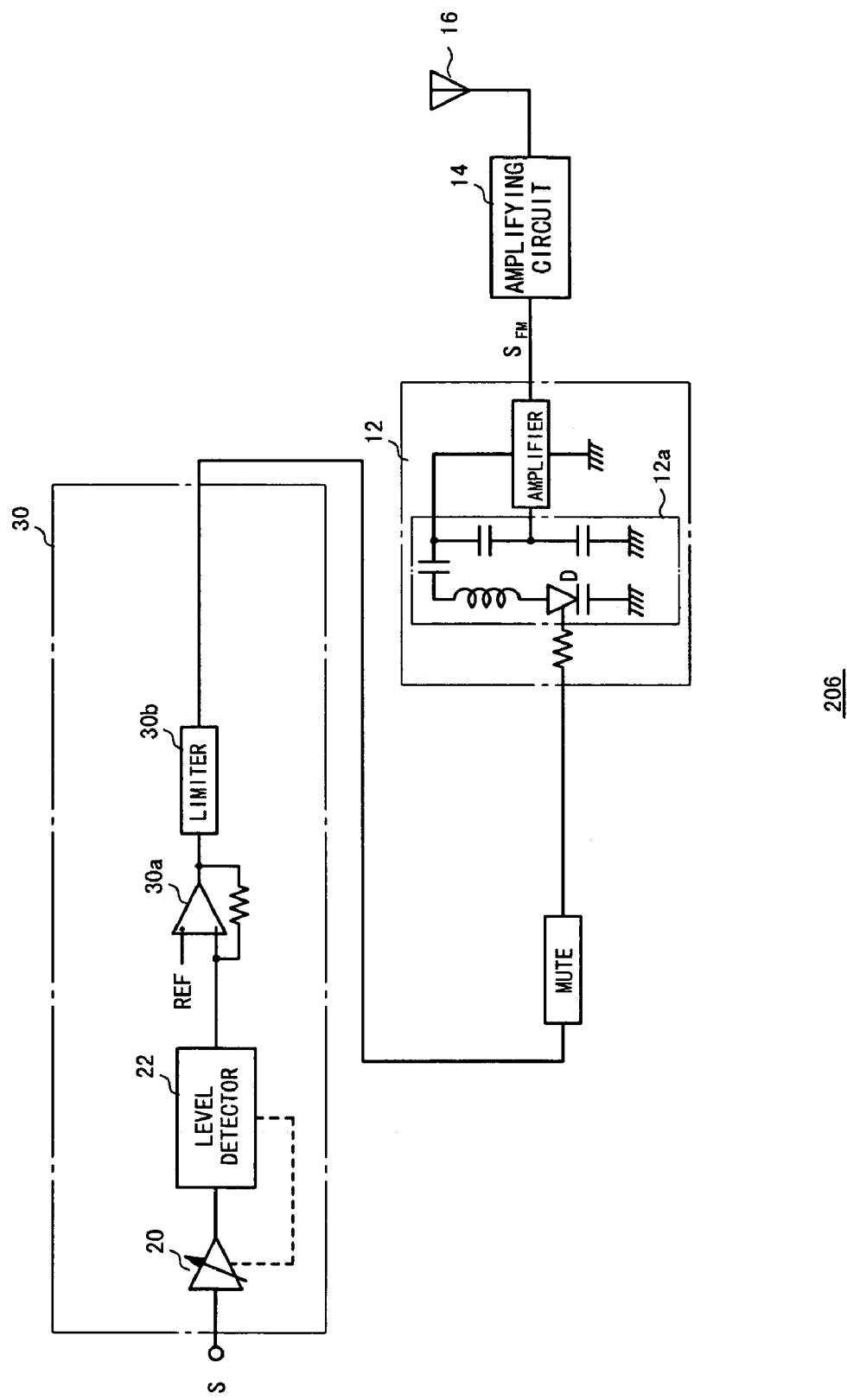
FIG. 4 is a block diagram showing still another transmission circuit in accordance with a preferred embodiment of the present invention.

FIG. 4 shows still another transmitting apparatus 206 according to a preferred embodiment of the present invention, preferably employable when a frequency-modulated monaural audio signal is transmitted, characterized in that the variable amplifier 20 and the level detector 22 are disposed at the input side of the front-end processing circuit 30.

In the front-end processing circuit 30, the variable amplifier 20 and the level detector 22 cooperatively constitute an automatic gain controller that can maintain the level of an input signal at a constant level. Furthermore, the preamp 30a and the limiter 30b process the signal and output the processed signal to the frequency modulation circuit 12. Accordingly, the signal supplied to the frequency modulation circuit 12 can be maintained at a constant level.

When a frequency-modulated stereo audio signal is transmitted, if the variable amplifier 20 and the level detector 22 are disposed at the input side of the front-end processing circuit 10, the right and left audio signals are independently controlled to a constant level. Thus, the ratio of the right and left levels in an input signal may disagree with the ratio of the right and left levels in an output signal.

According to the above-described embodiments of the present invention, the automatic gain controller constituted by the variable amplifier and the level detector can maintain the frequency modulation factor of the transmitting apparatus at an appropriate value within the range of modulation factors allowable in the frequency modulation detector of the receiving apparatus.

The above-described arrangement can be effectively used for a frequency modulation circuit including a Clapp oscillator or a Colpitts oscillator equipped with a variable capacitance element that can adjust the resonance frequency based on a change of the voltage.

More specifically, the above-described embodiments of the present invention can maintain the level of a signal applied to the varactor diode of the frequency modulation circuit, and can maintain the frequency modulation factor A of the transmitting apparatus at an appropriate value. Thus, the receiving apparatus can produce an output signal having an adequate S/N ratio without placing a heavy burden on a user.

Furthermore, the above-described embodiments of the present invention do not require the control circuit including the memory (e.g., register) storing a predetermined signal level. Therefore, the output signal having an adequate S/N ratio can be obtained without increasing the circuit scale of the transmitting apparatus, and the manufacturing cost does not increase.

FIRST PRACTICAL EXAMPLE

Figure 5:
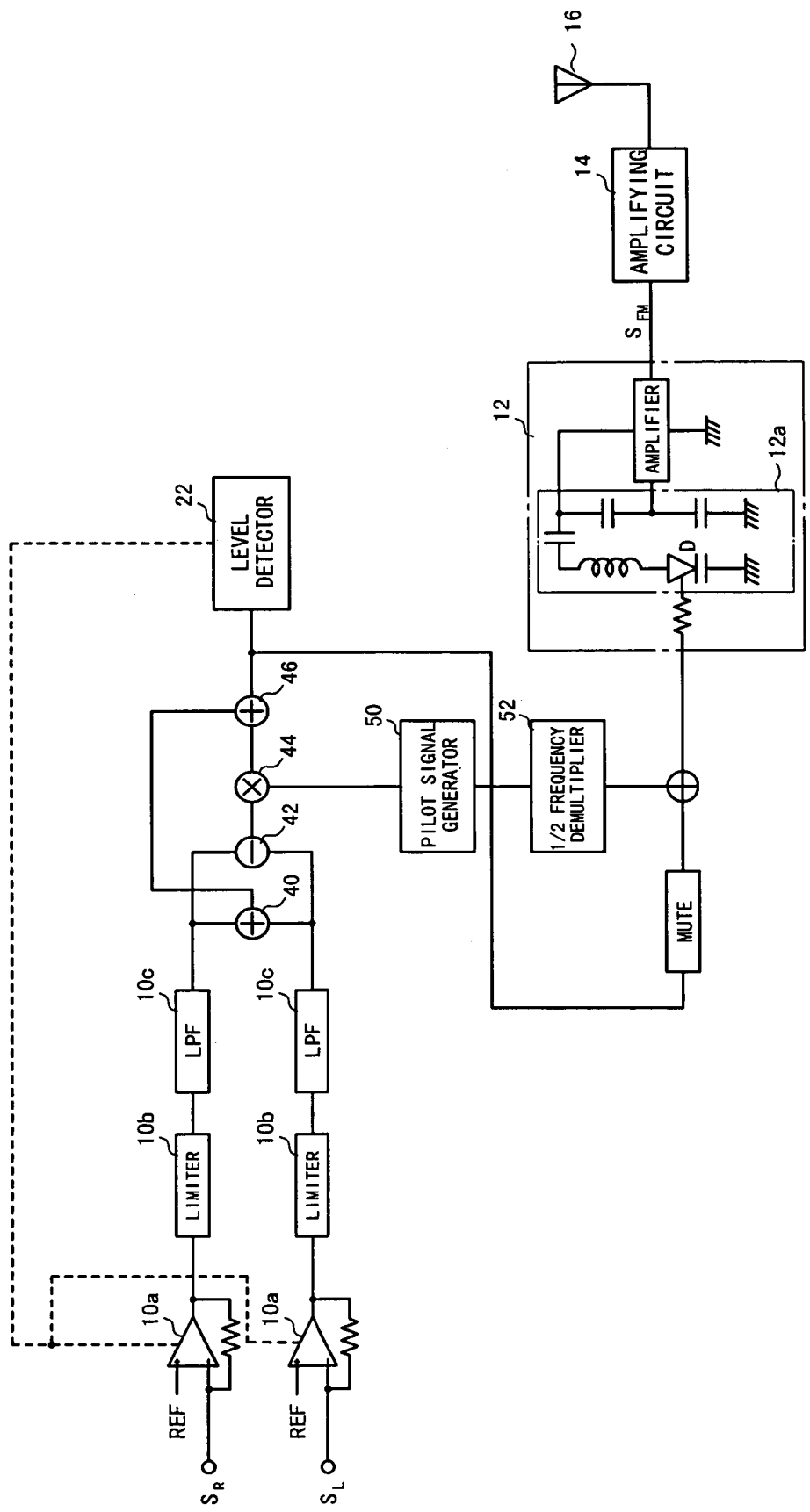
FIG. 5 is a block diagram showing a first practical example of the transmission circuit in accordance with the present invention.

FIG. 5 shows a first practical example of the transmission circuit according to the above-described embodiment of the present invention. The transmission circuit according to the first practical example includes an adder 40, a subtracter 42, a multiplier 44, an adder 46, a pilot signal generator 50, and a ½ frequency demultiplier 52. The adder 40 produces a sum of right and left audio signals and outputs a signal representing the summed-up value to the adder 46. The subtracter 42 produces a difference between the right and left audio signals and outputs a signal representing the obtained difference to the multiplier 44. The multiplier 44 calculates a product of an oscillation signal having a frequency equal to 38 kHz produced from the pilot signal generator 50 and an output value of the subtracter 42, and outputs a signal representing the calculated product to the adder 46. The adder 46 calculates a sum of the output value of the adder 40 and the output value of the multiplier 44 and outputs a signal representing the summed-up value to a mute circuit and to a level detector 22. The level detector 22 controls the amplification factor (gain) of the preamp 10a based on an input signal. The ½ frequency demultiplier 52 converts the oscillation signal having a frequency equal to 38 kHz produced from the pilot signal generator 50 into a pilot signal having a frequency equal to 19 kHz. An output signal of the ½ frequency demultiplier 52 is added to an output value of the mute circuit to produce an output value of the transmission circuit.

SECOND PRACTICAL EXAMPLE

Figure 6:
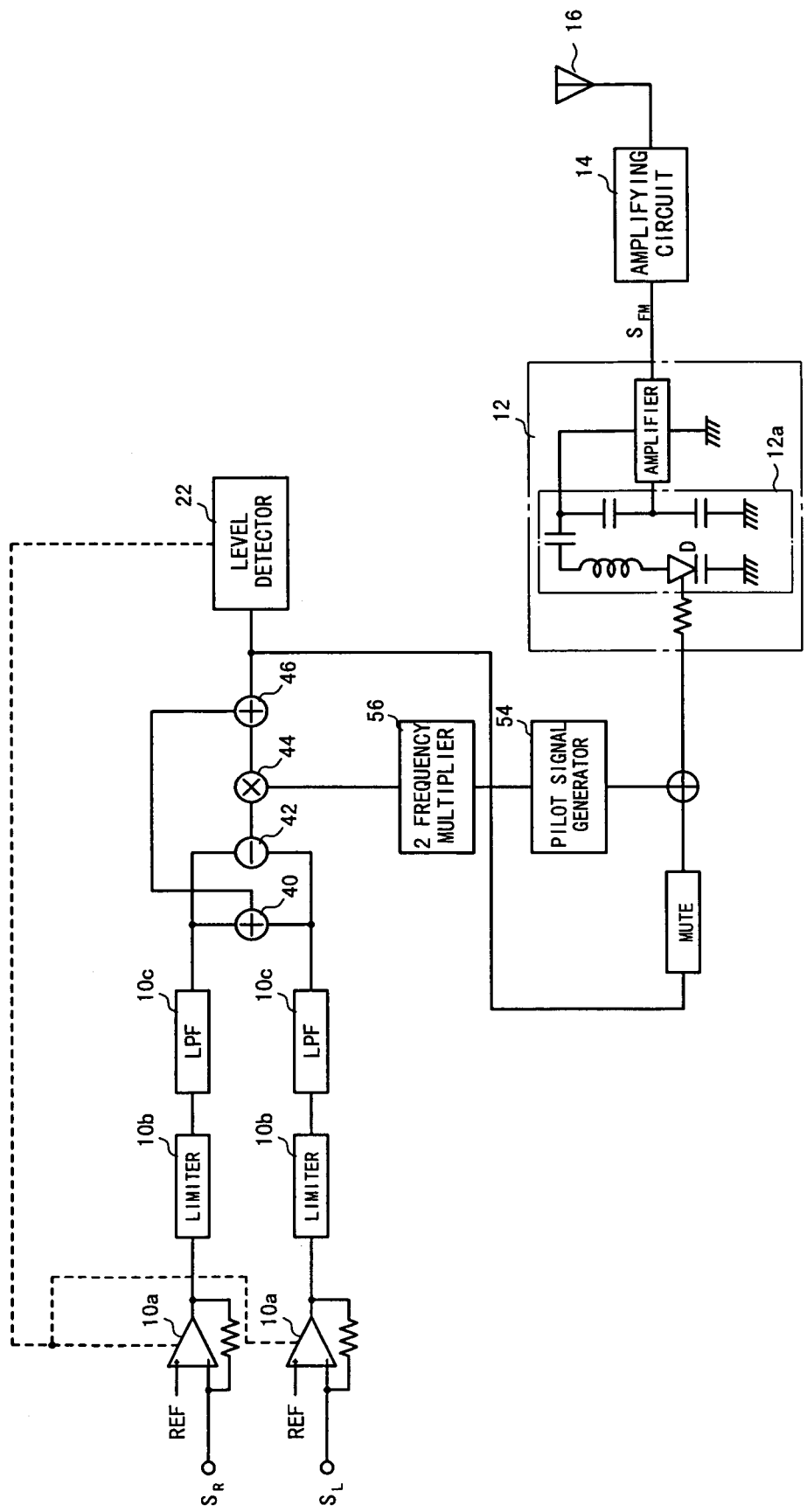
FIG. 6 is a block diagram showing a second practical example of the transmission circuit in accordance with the present invention.

FIG. 6 shows a second practical example of the transmission circuit according to the above-described embodiment of the present invention. The second practical example is different from the first practical example in that the pilot signal generator 50 and the ½ frequency demultiplier 52 are replaced with a pilot signal generator 54 and a 2 frequency multiplier 56. The 2 frequency multiplier 56 doubles the frequency of a pilot signal (19 kHz) produced from the pilot signal generator 54 and produces an oscillation signal having a frequency equal to 38 kHz. The rest of the second practical example is similar to the above-described arrangement of the first practical example.

THIRD PRACTICAL EXAMPLE

Figure 7:
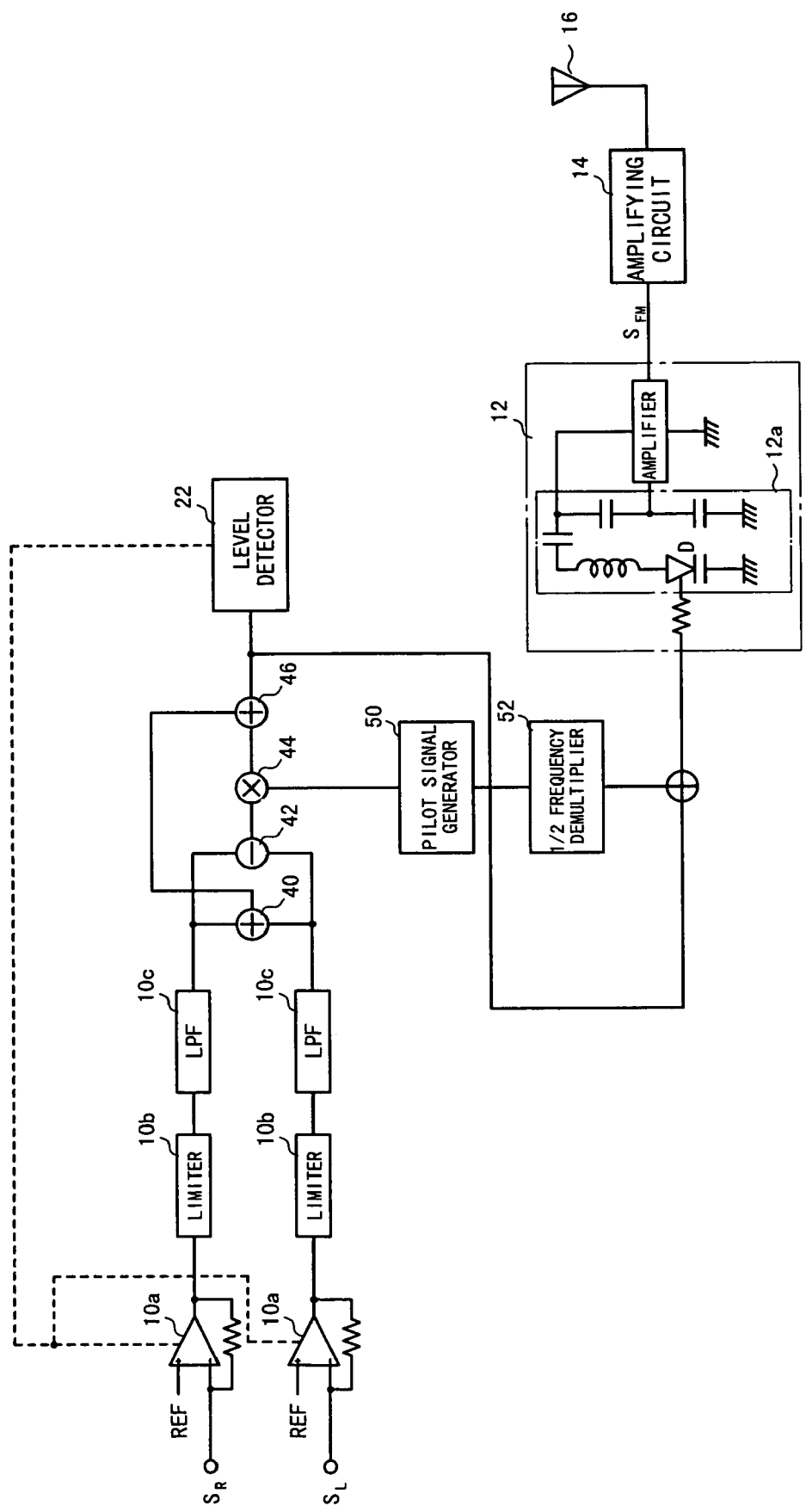
FIG. 7 is a block diagram showing a third practical example of the transmission circuit in accordance with the present invention.

FIG. 7 shows a third practical example of the transmission circuit according to the above-described embodiment of the present invention. The third practical example is different from the first practical example in that the mute circuit is not provided. The rest of the third practical example is similar to the above-described arrangement of the first practical example.

FOURTH PRACTICAL EXAMPLE

Figure 8:
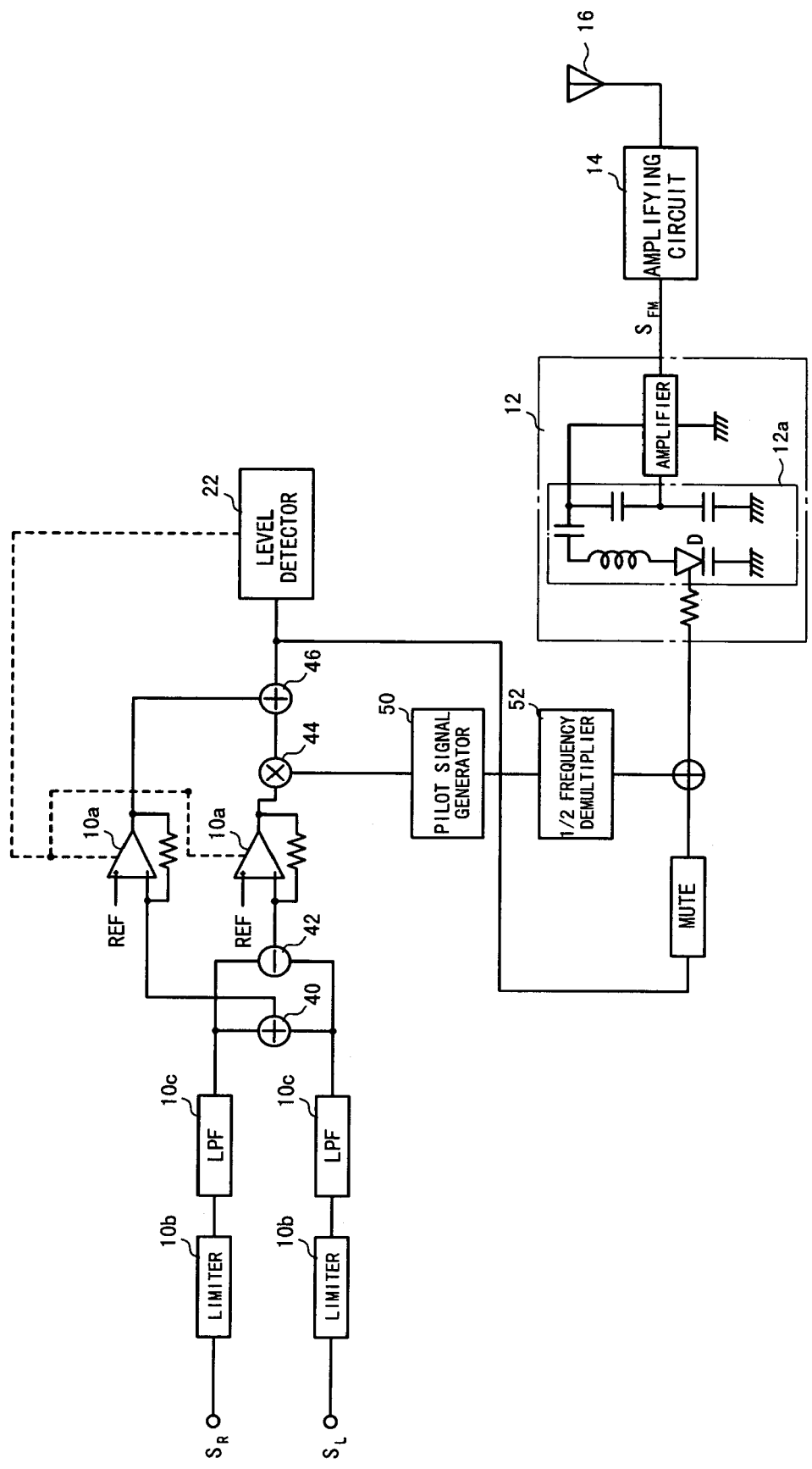
FIG. 8 is a block diagram showing a fourth practical example of the transmission circuit in accordance with the present invention.

FIG. 8 shows a fourth practical example of the transmission circuit according to the above-described embodiment of the present invention. The fourth practical example is different from the first practical example in that two preamps 10a are provided at the output side of the adder 40 and the subtracter 42. The rest of the fourth practical example is similar to the above-described arrangement of the first practical example.

FIFTH PRACTICAL EXAMPLE

Figure 9:
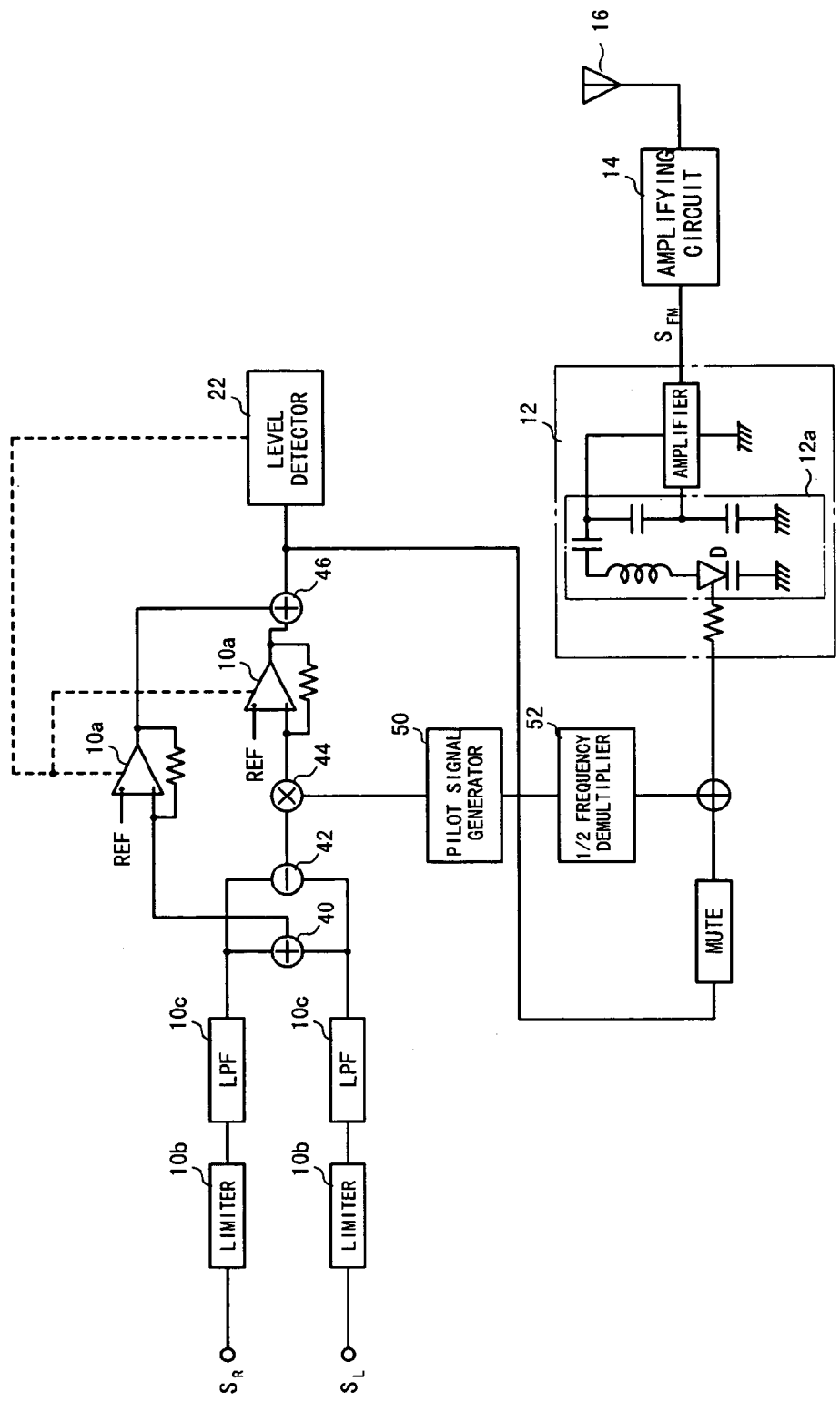
FIG. 9 is a block diagram showing a fifth practical example of the transmission circuit in accordance with the present invention.

FIG. 9 shows a fifth practical example of the transmission circuit according to the above-described embodiment of the present invention. The fifth practical example is different from the first practical example in that two preamps 10a are provided at the output side of the adder 40 and the multiplier 44. The rest of the fifth practical example is similar to the above-described arrangement of the first practical example.

SIXTH PRACTICAL EXAMPLE

Figure 10:
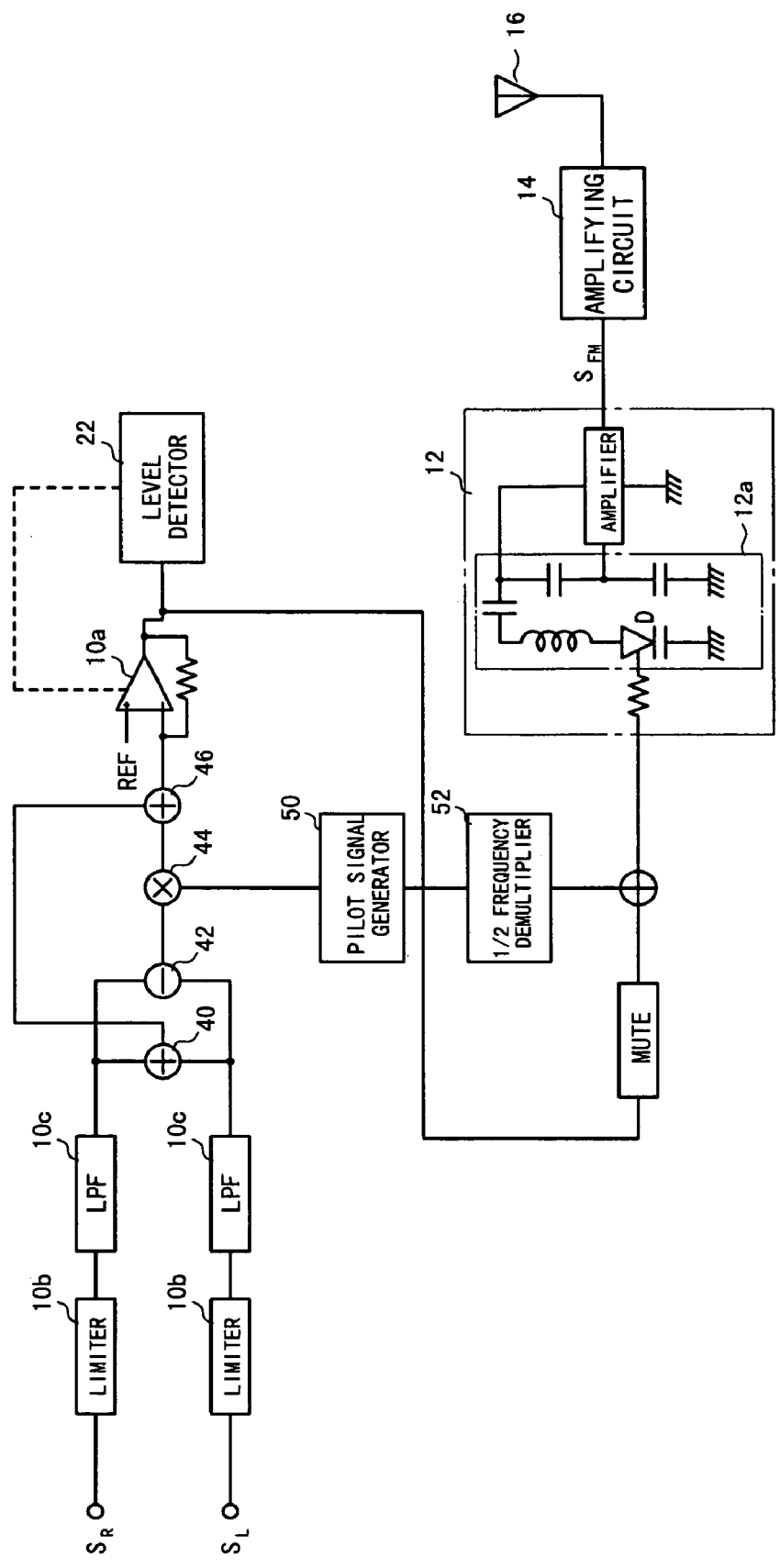
FIG. 10 is a block diagram showing a sixth practical example of the transmission circuit in accordance with the present invention.

FIG. 10 shows a sixth practical example of the transmission circuit according to the above-described embodiment of the present invention. The sixth practical example is different from the first practical example in that a single preamp 10a is provided at the output side of the adder 46. The rest of the sixth practical example is similar to the above-described arrangement of the first practical example. In this case, the circuit arrangement becomes simple because only one preamp 10a is required. Furthermore, a signal having a frequency equal to 38 kHz does not leak at the multiplier 44, and accordingly a direct-current offset is not generated.

As described above, the front-end processing circuit includes the mixer that outputs a right-and-left mixing signal of a received stereo audio signal. The variable amplifier amplifies the output signal of the mixer by the amplification factor (gain) corresponding to the feedback signal, so that the signal supplied to the frequency modulation circuit can be maintained at a constant level.

The variable amplifier and the level detector can automatically maintain a constant signal level after the right and left audio signals are mixed. The ratio of the right and left levels in an input audio signal can be equalized to the ratio of the right and left levels in an output audio signal.

More specifically, when the stereo audio signal is processed, if the variable amplifier and the level detector automatically adjust the signal level before the mixer mixes the right and left signals, the right and left audio signals are independently controlled to a constant level, even when the ratio of the right and left levels in an input audio signal is changed. As a result, the ratio of the right and left levels in an input audio signal disagrees with the ratio of the right and left levels in an output audio signal. The signal reproducibility is therefore deteriorated.

Furthermore, the front-end processing circuit includes a mixer outputting a right-and-left mixing signal of the received stereo audio signal, and an adder adding a pilot signal to the output signal of the mixer. The variable amplifier amplifies the output signal of the adder by the amplification factor (gain) corresponding to the feedback signal, so that the signal supplied to the frequency modulation circuit can be maintained at a constant level.

In this manner, a pilot signal can be added after the right and left audio signals are mixed. The signal level can be automatically maintained at a constant value by the variable amplifier and the level detector. In this case, the ratio of the right and left levels in an input audio signal can be equalized to the ratio of the right and left levels in an output audio signal.

What is claimed is:

1. A transmitting apparatus comprising:
a front-end processing circuit applying predetermined processing to an input signal and outputting a processed signal; and
a frequency modulation circuit applying frequency modulation to the output signal of the front-end processing circuit and outputting a processed signal,
wherein the front-end processing circuit comprises:
a variable amplifier receiving a feedback signal and amplifying a signal by an amplification factor corresponding to the feedback signal;
a level detector outputting the feedback signal to the variable amplifier in accordance with a level of a signal obtainable in a circuit succeeding the variable amplifier; and
a mixer receiving a stereo audio signal and outputting a right-and-left mixing signal of the received stereo audio signal, and the variable amplifier amplifies the output signal of the mixer by the amplification factor corresponding to the feedback signal, so that the signal supplied to the frequency modulation circuit can be maintained at a constant level,
wherein the front-end processing circuit maintains the signal supplied to the frequency modulation circuit at a constant level.

2. A transmitting apparatus comprising:
a front-end processing circuit applying predetermined processing to an input signal and outputting a processed signal; and
a frequency modulation circuit applying frequency modulation to the output signal of the front-end processing circuit and outputting a processed signal,
wherein the front-end processing circuit comprises:
a variable amplifier receiving a feedback signal and amplifying a signal by an amplification factor corresponding to the feedback signal;
a level detector outputting the feedback signal to the variable amplifier in accordance with a level of a signal obtainable in a circuit succeeding the variable amplifier; and
a mixer mixing a right-and-left signal of a received stereo audio signal and outputting a right-and left mixing signal, and an adder adding a pilot signal to the output signal of the mixer,
wherein the front-end processing circuit maintains the signal supplied to the frequency modulation circuit at a constant level, and
wherein the variable amplifier amplifies the output signal of the adder by the amplification factor corresponding to the feedback signal, so that the signal supplied to the frequency modulation circuit can be maintained at a constant level.

* * * * *